(12) United States Patent
Jomori

(10) Patent No.: US 11,365,970 B2
(45) Date of Patent: *Jun. 21, 2022

(54) VIBRATION TYPE ANGULAR VELOCITY SENSOR WITH PIEZOELECTRIC FILM

(71) Applicant: DENSO CORPORATION, Kariya (JP)

(72) Inventor: Tomoya Jomori, Kariya (JP)

(73) Assignee: DENSO CORPORATION, Kariya (JP)

( * ) Notice: Subject to any disclaimer, the term of this patent is extended or adjusted under 35 U.S.C. 154(b) by 312 days.

This patent is subject to a terminal disclaimer.

(21) Appl. No.: 16/690,281

(22) Filed: Nov. 21, 2019

(65) Prior Publication Data

US 2020/0088519 A1 Mar. 19, 2020

Related U.S. Application Data

(63) Continuation of application No. PCT/JP2018/026366, filed on Jul. 12, 2018.

(30) Foreign Application Priority Data

Jul. 20, 2017 (JP) .............................. JP2017-141145

(51) Int. Cl.
*G01C 19/5747* (2012.01)
*H01L 41/113* (2006.01)
*G01C 19/5762* (2012.01)

(52) U.S. Cl.
CPC ..... *G01C 19/5747* (2013.01); *G01C 19/5762* (2013.01); *H01L 41/1132* (2013.01); *H01L 41/1134* (2013.01)

(58) Field of Classification Search
CPC ............ G01C 19/5747; G01C 19/5762; G01C 191/5719; G01C 19/5712; G01C 19/56; G01P 3/14; G01P 3/44; H01L 41/1132
See application file for complete search history.

(56) References Cited

U.S. PATENT DOCUMENTS

| | | | | |
|---|---|---|---|---|
| 8,640,540 B2* | 2/2014 | Oshio | ................ | G01C 19/5762 73/504.04 |
| 9,523,705 B2* | 12/2016 | Kim | ........................ | G01C 19/56 |
| 11,054,260 B2* | 7/2021 | Jomori | ............... | G01C 19/5747 |
| 2002/0078746 A1* | 6/2002 | Mochida | ............... | G01P 15/097 73/504.12 |

(Continued)

FOREIGN PATENT DOCUMENTS

JP H07-294262 A 11/1995

*Primary Examiner* — Helen C Kwok

(74) *Attorney, Agent, or Firm* — Posz Law Group, PLC

(57) ABSTRACT

An angular velocity sensor includes: a substrate; a drive beam supported via a support member with a fixing part; a drive weight supported with the drive beam; a detection weight supported via a beam part including a detection beam with the drive weight; and a detection part in the detection beam generating an electric output corresponding to a displacement of the detection beam when an angular velocity is applied. When the angular velocity is applied while the drive weight and the detection weight vibrate and are driven by the drive beam, the detection beam is displaced in a direction intersecting the vibration direction. The angular velocity is detected based on a change of an output voltage of a detection piezoelectric film in accordance with a displacement of the detection beam.

5 Claims, 7 Drawing Sheets

(56) References Cited

U.S. PATENT DOCUMENTS

| | | | |
|---|---|---|---|
| 2002/0157466 A1* | 10/2002 | Terada | G01C 19/5642 |
| | | | 73/504.12 |
| 2003/0131664 A1* | 7/2003 | Mochida | G01C 19/5719 |
| | | | 73/504.12 |
| 2004/0095046 A1 | 5/2004 | Ouchi et al. | |
| 2005/0204816 A1* | 9/2005 | Tokunaga | G01C 19/5719 |
| | | | 73/504.16 |
| 2010/0116050 A1* | 5/2010 | Wolfram | G01C 19/574 |
| | | | 73/504.12 |
| 2013/0270659 A1* | 10/2013 | Jomori | H01L 29/84 |
| | | | 257/417 |
| 2014/0360265 A1* | 12/2014 | Jomori | G01C 19/5747 |
| | | | 73/504.12 |
| 2015/0168437 A1* | 6/2015 | Jomori | G01C 19/5747 |
| | | | 73/496 |
| 2016/0123736 A1 | 5/2016 | Nakagawa et al. | |
| 2017/0052027 A1* | 2/2017 | Jomori | B81B 3/0021 |
| 2019/0092620 A1* | 3/2019 | Jomori | B81B 3/0045 |

* cited by examiner

VIBRATION TYPE ANGULAR VELOCITY SENSOR WITH PIEZOELECTRIC FILM

CROSS REFERENCE TO RELATED APPLICATION

The present application is a continuation application of International Patent Application No. PCT/JP2018/026366 filed on Jul. 12, 2018, which designated the U.S. and claims the benefit of priority from Japanese Patent Application No. 2017-141145 filed on Jul. 20, 2017. The entire disclosures of all of the above applications are incorporated herein by reference.

TECHNICAL FIELD

The present disclosure relates to a vibration type angular velocity sensor to detect an applied angular velocity.

BACKGROUND

Conventionally, as a tuning-fork type and piezoelectric thin-film type vibration-type angular velocity sensor, for example, a gyro sensor is known. The gyro sensor has a tuning fork of a non-piezoelectric material formed with two arms and a base connecting them, and a driving part and a detection part formed on one surface of the arm and aligned with the arm longitudinal direction. The driving part and the detection part are formed with a piezoelectric film and two electrodes, which oppose to each other. The piezoelectric film is held between the two electrodes. The driving part causes predetermined drive vibration of the arms in a plane direction in one surface of the arm. Upon application of an angular velocity, the gyro sensor detects the angular velocity by vibration of the detection part in a direction intersecting the direction of the drive vibration.

SUMMARY

According to an example, an angular velocity sensor includes: a substrate; a drive beam supported via a support member with a fixing part; a drive weight supported with the drive beam; a detection weight supported via a beam part including a detection beam with the drive weight; and a detection part in the detection beam generating an electric output corresponding to a displacement of the detection beam when an angular velocity is applied. When the angular velocity is applied while the drive weight and the detection weight vibrate and are driven by the drive beam, the detection beam is displaced in a direction intersecting the vibration direction. The angular velocity is detected based on a change of an output voltage of a detection piezoelectric film in accordance with a displacement of the detection beam.

BRIEF DESCRIPTION OF THE DRAWINGS

The above and other objects, features and advantages of the present disclosure will become more apparent from the following detailed description made with reference to the accompanying drawings. In the drawings:

FIG. 7 is an enlarged view showing the state of displacement of the detection beam and a detection piezoelectric film upon unintended rotational vibration of a detection weight due to a processing error or the like.

DETAILED DESCRIPTION

Figure 1:
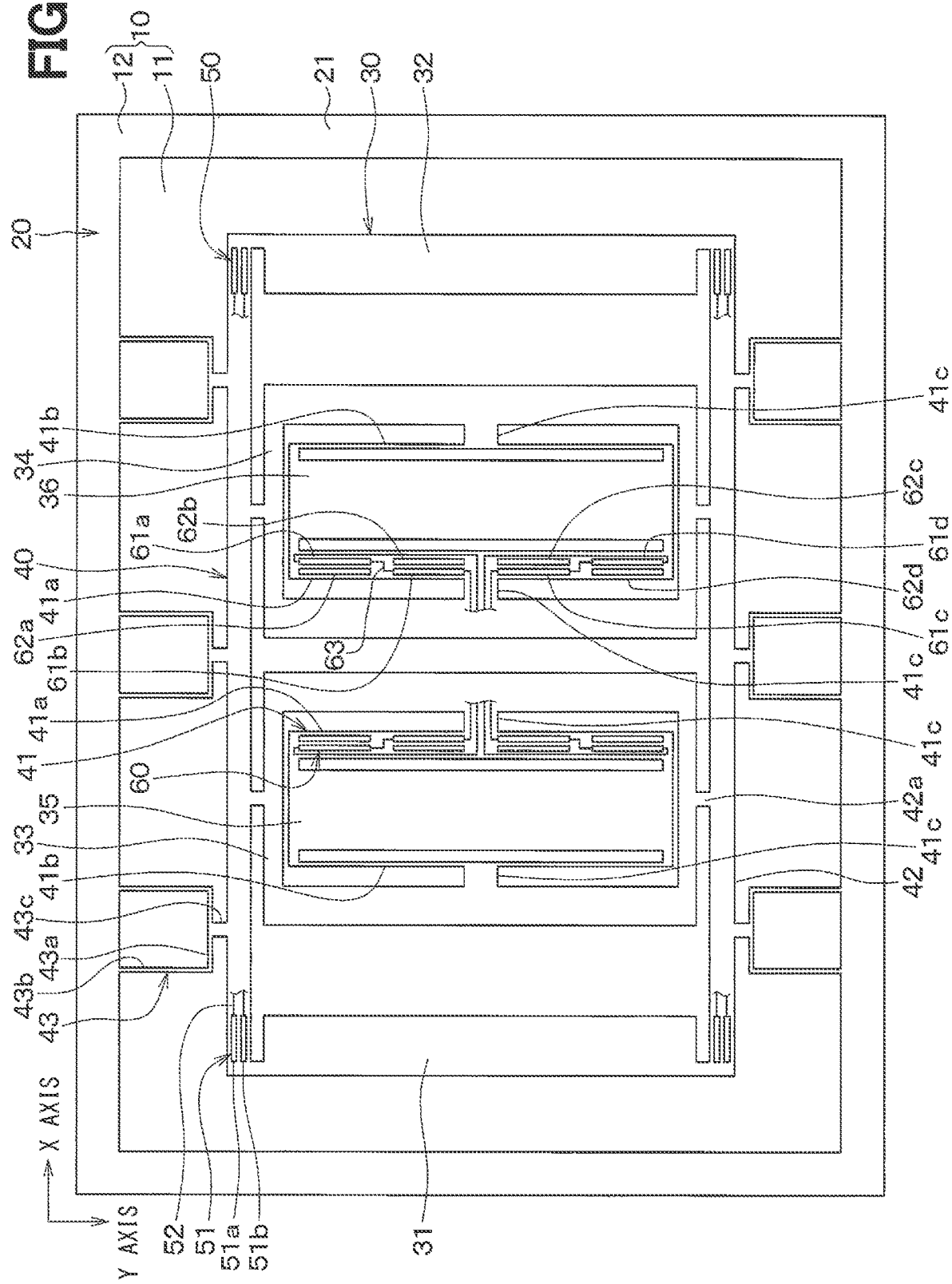
FIG. 1 is a plane schematic diagram showing a vibration type angular velocity sensor according to a first embodiment.

When the tuning-fork type gyro sensor has a structure in which the detection part is provided along a center line in a vertical direction with respect to the arm longitudinal direction, and symmetrically provided with respect to the center line, ideally, tension and contraction in the detection part occur in equal areas. That is, ideally, when the driving part is caused to perform drive vibration, tension and contraction in the drive vibration direction in the detection part respectively occur in equal areas. In this case, in the detection part, as the electric charge which occurs by the tension and the electric charge which occurs by the contraction, caused by the drive vibration, offset each other, and signal(s) not related to the application of the angular velocity are cancelled. The influence on the detection of the angular velocity is suppressed.

However, actually, a dimensional error in processing of the tuning fork, the driving part, and the detection part, an alignment error, and the like occurs. Accordingly, the tension and the contraction in the drive vibration direction in the detection part do not occur in equal areas. The electric charges occur by these deformations do not offset each other. In this case, a phenomenon that unintended signal(s) i.e. noise is generated by the drive vibration (hereinbelow, "leak vibration") occurs. The accuracy of the angular velocity detection is lowered.

The present embodiments provide a vibration type angular velocity sensor which has a structure capable of suppressing occurrence of leak vibration, and which has improved accuracy of angular velocity detection, in comparison with the conventional vibration type angular velocity sensor.

A vibration type angular velocity sensor detects an applied angular velocity by displacement of a detection weight, which is displaceably supported with a spring, based on the application of the angular velocity.

To attain the above-described object, a vibration type angular velocity sensor in a first viewpoint is a vibration type angular velocity sensor to detect an angular velocity, comprising: a substrate; a drive beam supported via a support member with a fixing part formed on the substrate; a drive weight supported with the drive beam; a detection weight supported via a beam part including a detection beam with respect to the drive weight; and a detection part provided in the detection beam, that generates electric output in correspondence with displacement of the detection beam in accordance with movement of the detection weight when the detection weight moves in one direction based on application of an angular velocity. In this configuration, the detection weight is connected via the detection beam to the drive weight, and is connected via the drive weight to the fixing part. With a direction in which the drive weight and the detection weight vibrate upon driving of the drive beam as a vibration direction, when the angular velocity is applied upon drive vibration of the drive weight and the detection weight with the drive beam, the detection beam is displaced in a direction intersecting the vibration direction, and detects the angular velocity based on change of an output voltage of a detection piezoelectric film in accordance with the displacement of the detection beam.

With this configuration, the detection beam is displaced in the direction intersecting the vibration direction of the detection beam upon drive vibration of the drive beam. Accordingly, upon drive vibration, the vibration direction of the detection beam is the same as the vibration direction of the drive weight and the detection weight. That is, unintended deformation of the detection beam by drive vibration is suppressed, and the occurrence of leak vibration is suppressed. As a result, a vibration type angular velocity sensor, in which leak vibration is suppressed, and the accuracy of angular velocity detection is improved, in comparison with the conventional vibration type angular velocity sensor, is provided.

Hereinbelow, embodiments of the present disclosure will be described based on the drawings. Note that in the following respective embodiments, the elements the same or equivalent to each other have the same reference numerals.

First Embodiment

A vibration type angular velocity sensor according to a first embodiment, i.e., a so-called gyro sensor, will be described.

The vibration type angular velocity sensor according to the present embodiment is a sensor to detect an angular velocity. It is used for, e.g., detection of a rotational angular velocity around a center line parallel to a vehicle vertical direction. It is needless to say that the vibration type angular velocity sensor is applicable to other purposes than the vehicle.

FIG. 1 is a plane schematic diagram of the vibration type angular velocity sensor according to the present embodiment. The vibration type angular velocity sensor is mounted in the vehicle such that the normal direction of the drawing of FIG. 1 corresponds with the vertical direction of the vehicle.

The vibration type angular velocity sensor is formed on one surface side of a plate type substrate 10. The substrate 10 is configured with an SOI (Silicon On Insulator) substrate having a structure in which an unshown embedded oxide film as a sacrificial layer is held between a support substrate 11 and a semiconductor layer 12. The sensor structure is formed by etching the semiconductor layer 12 side in a pattern of a sensor structure, then partially removing the embedded oxide film, to set the structure in a status where a part of the sensor structure is released.

Note that the following description will be made assuming that a direction on a plane parallel to the surface of the semiconductor layer 12 and in a horizontal direction of the drawing is an x-axis direction, a vertical direction of the drawing vertical to the x-axis direction is a y-axis direction, and a direction vertical to one surface of the semiconductor layer 12 is a z-axis direction.

The semiconductor layer 12 is patterned in a fixing part 20, a movable part 30, and a beam part 40. In the fixing part 20, the embedded oxide film remains in at least a part of a back surface. The fixing part 20 is in a state where the fixing part is not released from the support substrate 11, but is fixed via the embedded oxide film to the support substrate 11. The movable part 30 and the beam part 40 form a vibrator in the vibration type angular velocity sensor. The movable part 30 is in a state where the embedded oxide film on the back surface side is removed and the movable part 30 is released from the support substrate 11. The beam part 40 supports the movable part 30, and to perform angular velocity detection, the beam part 40 displaces the movable part 30 in the x-axis direction and the y-axis direction. More particular structures of the fixing part 20, the movable part 30, and the beam part 40 will be described.

The fixing part 20 is configured to have a support fixing part 21 to support the movable part 30.

The support fixing part 21 is provided so as to surround, e.g., the sensor structure such as the movable part 30 and the beam part 40. The support fixing part 21 supports the movable part 30 via the beam part 40, in the inner wall of the support fixing part 21. The structure in which the support fixing part 21 surrounds the entire perimeter of the sensor structure is given as an example here, however, a structure in which the support fixing part is formed only a part of the perimeter may be used. Note that the fixing part 20 may have a structure provided with another fixing part different from the support fixing part 21, e.g., a pad fixing part in which an unshown pad or the like is formed.

The movable part 30 is a part displaced in accordance with application of an angular velocity. The movable part 30 is configured to have outer drive weights 31 and 32, inner drive weights 33 and 34, and detection weights 35 and 36. The movable part 30 has a layout in which the outer drive weight 31, the inner drive weight 33 having the detection weight 35, the inner drive weight 34 having the detection weight 36, and the outer drive weight 32, in this order, are arrayed along the x-axis direction. That is, the movable part 30 has a structure in which the two inner drive weights 33 and 34 having the detection weights 35 and 36 inside are arrayed inside, and further, the outer drive weights 31 and 32 are provided one by one on, so as to hold the two inner drive weights 33 and 34 between the outer drive weights 31 and 32, on both outer sides.

The outer drive weights 31 and 32 are extended in the y-axis direction. The outer drive weight 31 is oppositely provided to the inner drive weight 33. The outer drive weight 32 is oppositely provided to the inner drive weight 34. These outer drive weights 31 and 32 function as mass parts. The outer drive weights 31 and 32 are thicker than various beams included in the beam part 40. The outer drive weights 31 and 32 are movable in the y-axis direction as a vibration direction upon drive vibration with a drive beam 42 and a drive part 50 to be described later.

The inner drive weights 33 and 34 have a square frame shape. These inner drive weights 33 and 34 function as mass parts. The inner drive weights 33 and 34 are thicker than the various beams included in the beam part 40. The inner drive weights 33 and 34 are movable in the y-axis direction. The two opposite sides of the square-shaped inner drive weights 33 and 34 are respectively parallel to the x-axis direction and the y-axis direction. In the inner drive weights 33 and 34, one side of the two sides parallel to the y-axis direction is oppositely provided to the outer drive weights 31 and 32, and the other side is oppositely provided to the other one of the inner drive weights 33 and 34.

The detection weights 35 and 36 have a square shape. The detection weights 35 and 36 are supported with the inner wall surfaces of the inner drive weights 33 and 34 via a detection beam 41 to be described later in the beam part 40. The detection weights 35 and 36 also function as mass parts. The detection weights 35 and 36 are moved along with the inner drive weights 33 and 34 in the y-axis direction by drive vibration. Upon application of the angular velocity, the detection weights 35 and 36 are moved in the x-axis direction.

The beam part 40 is configured to have the detection beam 41, the drive beam 42, and a support member 43.

The detection beam 41 connects a side of the inner wall surface, parallel to the y-axis direction, in the inner drive weights 33 and 34, to a side of the outer wall surfaces, parallel to the y-axis direction, in the detection weights 35 and 36. In the case of the present embodiment, the detection beam 41 is linearly extended along the y-axis direction as the vibration direction of the drive weights 31 to 34. The detection beam 41 is a beam having a structure to support the detection weights 35 and 36 at both ends in the vibration direction, in shifted positions, in the x-axis direction. In the structure, the detection beam 41 is provided on the both sides of the respective detection weights 35 and 36 in the x-axis direction. One of the detection beams 41, as a first detection beam 41a, and the other one of the detection beams 41, as a second detection beam 41b, support the detection weights 35 and 36 on the both sides in the x-axis direction. Further, both of the first detection beam 41a and the second detection beam 41b are connected, with a central part in the y-axis direction as a connection part 41c, to the inner walls of the inner drive weights 33 and 34, in the connection part 41c. The detection beam 41, on the both sides of the connection part 41c as a center, supports the both ends of the detection weights 35 and 36 in the y-axis direction.

In this configuration, the detection beam 41 is provided such that the y-axis direction as the vibration direction upon drive vibration is a longitudinal direction. When an angular velocity is applied, for example, the detection beam 41 is displaceable in the x-axis direction as the direction intersecting the vibration direction. With the displacement of the detection beam 41 in the x-axis direction, the detection weights 35 and 36 are movable in the x-axis direction.

Note that as the detection beam 41 is provided such that the y-axis direction as the vibration direction of the drive weights 31 to 34 and the detection weights 35 and 36 is the longitudinal direction, leak vibration is suppressed in the vibration type angular velocity sensor according to the present embodiment. The details of this structure will be described later.

Further, in the present embodiment, the first detection beam 41a and the second detection beam 41b have different spring constants. In the case of the present embodiment, since the first detection beam 41a and the second detection beam 41b are formed by patterning the semiconductor layer 12, the first detection beam 41a and the second detection beam 41b are formed of the same material. Accordingly, the first detection beam 41a and the second detection beam 41b are formed to have different dimensions in the x-axis direction. In this configuration, the spring constants of the first detection beam 41a and the second detection beam 41b have different values.

More precisely, the inner side of the respective detection weights 35 and 36, i.e., the detection weight 36 side of the detection weight 35 and the detection weight 35 side of the detection weight 36 is the first detection beam 41a, and the opposite side is the second detection beam 41b. As the dimension of the first detection beam 41a in the x-axis direction is larger than the dimension of the second detection beam 41b in the x-axis direction, the spring constant of the first detection beam 41a has a large value.

The drive beam 42 connects the outer drive weights 31 and 32 to the inner drive weights 33 and 34, and enables movement of the outer drive weights 31 and 32 and the inner drive weights 33 and 34 in the y-axis direction. The outer drive weight 31 as one of the outer drive weights, the inner drive weight 33 as one of the inner drive weights, the inner drive weight 34 as the other one of the inner drive weights, and the outer drive weight 32 as the other one of the outer drive weights, in this order, in an arrayed status, are connected with the drive beam 42.

More particularly, the drive beam 42 is a linear beam in which the width in the y-axis direction is a predetermined dimension. The drive beam 42 is provided, one by one, on the both sides in the y-axis direction, to hold the outer drive weights 31 and 32 and the inner drive weights 33 and 34, between the both sides. The respective drive beams 42 are connected to the outer drive weights 31 and 32 and the inner drive weights 33 and 34. The drive beam 42 may be directly connected to the outer drive weights 31 and 32 and the inner drive weights 33 and 34. For example, in the present embodiment, the drive beam 42 and the inner drive weights 33 and 34 are connected via a connection part 42a.

The support member 43 supports the outer drive weights 31 and 32, the inner drive weights 33 and 34, and the detection weights 35 and 36. More particularly, the support member 43 is provided between the inner wall surface of the support fixing part 21 and the drive beam 42. The support member 43 supports the above respective weights 31 to 36 via the drive beam 42 with the support fixing part 21.

The support member 43 is configured to have a rotating beam 43a, a support beam 43b, and a connection part 43c. The rotating beam 43a is a linear beam in which the width in the y-axis direction is a predetermined dimension. The support beam 43b is connected to the both ends of the rotating beam 43a, and the connection part 43c is connected to a center position of the rotating beam 43a in the x-axis direction. Upon driving of the sensor, the rotating beam 43a is ripple-bent in S shape around the connection part 43c. The support beam 43b connects the both ends of the rotating beam 43a to the support fixing part 21. In the present embodiment, the support beam 43b is a linear member. The support beam 43b plays a role of allowing the respective weights 31 to 36 to move in the x-axis direction upon application of shock or the like. The connection part 43c has a role of connecting the support member 43 to the drive beam 42.

Further, the vibration type angular velocity sensor according to the present embodiment is provided with the drive part 50 and a detection part 60.

The drive part 50 is provided for drive-vibrating the sensor structure such as the movable part 30 and the beam part 40. More particularly, the drive part 50 is configured with a drive piezoelectric film 51, a drive wiring 52 and the like provided at respective both ends of the respective drive beams 42.

The drive piezoelectric film 51 is configured with a PZT (abbreviation of Lead Zirconate Titanate) thin film or the like. When a drive voltage is applied through the drive wiring 52, the drive piezoelectric film 51 generates a force to drive-vibrate the sensor structure. Two drive piezoelectric films 51 are provided at respective both ends of the respective drive beams 42. One of the drive piezoelectric films 51 positioned on the outer edge side of the sensor structure is an outer piezoelectric film 51a, and the other one of the drive piezoelectric films 51 positioned inside from the outer piezoelectric film 51a is an inner piezoelectric film 51b. These outer piezoelectric film 51a and the inner piezoelectric film 51b are extended in the x-axis direction, and are formed in parallel to each other in the respective positions.

The drive wiring 52 is a wiring to apply a drive voltage to the outer piezoelectric film 51a and the inner piezoelectric film 51b. Only a part of the drive wiring 52 is shown in the drawing, however, actually, the drive wiring 52 is extended from the drive beam 42 through the support member 43 to the fixing part 20. The drive wiring 52 is electrically connected to the outside by wire bonding or the like via an unshown pad formed in the fixing part 20. With this configuration, it is possible to apply a drive voltage through the drive wiring 52 to the outer piezoelectric film 51a and the inner piezoelectric film 51b.

The detection part 60 is a part to output displacement of the detection beam 41 in accordance with application of an angular velocity as an electric signal. In the case of the present embodiment, the detection part 60 is formed in the first detection beam 41a having a large spring constant, among the detection beams 41. The detection part 60 is configured to have detection piezoelectric films 61a to 61d, dummy piezoelectric films 62a to 62d, and a detection wiring 63.

The detection piezoelectric films 61a to 61d are configured with a PZT thin film or the like. The detection piezoelectric films 61a to 61d are formed in a position, to which tensile stress is applied upon displacement of the first detection beam 41a by application of the angular velocity, in the first detection beam 41a. More particularly, in the first detection beam 41a, the detection piezoelectric films 61a to 61d are provided on the detection weights 35 and 36 side in the x-axis direction on the both end sides. On the connection part 41c side, the detection piezoelectric films 61a to 61d are provided on the side away from the detection weights 35 and 36 in the x-axis direction.

The dummy piezoelectric films 62a to 62d are configured with a PZT thin film or the like. The dummy piezoelectric films 62a to 62d are provided symmetrically to the detection piezoelectric films 61a to 61d so as to maintain the symmetry of the detection beam 41. That is, in the first detection beam 41a, the dummy piezoelectric films 62a to 62d are formed in a position to which compressive stress is applied upon displacement of the first detection beam 41a by application of the angular velocity. More particularly, on the both end sides of the first detection beam 41a, the dummy piezoelectric films 62a to 62d are provided on the side away from the detection weights 35 and 36 in the x-axis direction. On the connection part 41c side, the dummy piezoelectric films 62a to 62d are provided on the detection weights 35 and 36 side in the x-axis direction.

Both of the detection piezoelectric films 61a to 61d and the dummy piezoelectric films 62a to 62d are extended in the y-axis direction as the drive direction of the detection weights 35 and 36, and are formed in parallel to each other in the respective positions. Note that the example, in which the detection piezoelectric films 61a to 61d are formed in a position where tensile stress to cause the largest displacement occurs, is described here. The detection piezoelectric films 61a to 61d may be formed in a position where compressive stress occurs, or may be formed on both of the position where tensile stress occurs and the position where compressive stress occurs.

For example, it may be configured such that in the first detection beam 41a on the left side in the x-axis direction in FIG. 1, the detection piezoelectric films 61a to 61d are formed in a position where compressive stress occurs, and in the first detection beam 41a on the right side in the x-axis direction in FIG. 1, the detection piezoelectric films 61a to 61d are formed in a portion where tensile stress, upon application of the angular velocity, otherwise, the detection piezoelectric films 61a to 61d may be formed in a reversed manner.

Further, the dummy piezoelectric films 62a to 62d are not necessarily formed as long as at least the detection piezoelectric films 61a to 61d are formed.

The detection piezoelectric films 61a to 61d are provided symmetrically to a direction vertical to the longitudinal direction of the detection beam 41 and to a straight line passing through the center position in the longitudinal direction (hereinbelow, simply "line symmetrically provided"). Further, in the first detection beam 41a on the left side and in the first detection beam 41a on the right side in the x-axis direction in FIG. 1, the arrangement of the respective detection piezoelectric films 61a to 61d may be the same, or may be different. In any of the detection beams 41a, the detection piezoelectric films 61a to 61d are line-symmetrically provided.

The detection wiring 63 is connected to the detection piezoelectric films 61a to 61d. The detection wiring 63 extracts electric output of the detection piezoelectric films 61a to 61d in accordance with the displacement of the detection beam 41. In the drawing, only a part of the detection wiring 63 is shown, however, actually, the detection wiring 63 is extended from the inner drive weights 33 and 34 and the drive beam 42 through the support member 43 to the fixing part 20. The detection wiring 63 is electrically connected to the outside by wire bonding or the like via an unshown pad formed in the fixing part 20. With this configuration, the detection part 60 transmits the change of the electric output of the detection piezoelectric films 61a to 61d through the detection wiring 63.

With the structure as described above, the vibration type angular velocity sensor having a pair of angular velocity detection structures respectively provided with the respectively two outer drive weights 31 and 32, the inner drive weights 33 and 34, and the detection weights 35 and 36, is configured. In the vibration type angular velocity sensor having this structure, desired sensitivity is obtained as described later.

Next, the operation of the vibration type angular velocity sensor having this configuration will be described with reference to FIG. 2 to FIG. 4.

First, a state of the vibration type angular velocity sensor during a basic operation will be described with reference to FIG. 2. A desired drive voltage is applied to the drive part 50 provided at the both ends of the respective drive beams 42. The respective drive weights 31 to 34 are vibrated in the y-axis direction based on the drive voltage.

More particularly, regarding the drive part 50 provided at the left end of the drive beam 42 on the upper side of the drawing, tensile stress is generated with the outer piezoelectric film 51a, and compressive stress is generated with the inner piezoelectric film 51b. On the other hand, regarding the drive part 50 provided at the right end of the drive beam 42 on the upper side of the drawing, compressive stress is generated with the outer piezoelectric film 51a, and tensile stress is generated with the inner piezoelectric film 51b. This configuration is realized by applying an anti-phase voltage to the outer piezoelectric films 51a or the inner piezoelectric films 51b in the drive parts 50 provided on the both of right and left sides of the drive beam 42 on the upper side of the drawing.

On the other hand, regarding the drive part 50 provided at the left end of the drive beam 42 on the lower side of the drawing, compressive stress is generated with the outer piezoelectric film 51a, and tensile stress is generated with the inner piezoelectric film 51b. On the other hand, regarding the drive part 50 provided at the right end of the drive beam 42 on the lower side of the drawing, tensile stress is generated with the outer piezoelectric film 51a, and compressive stress is generated with the inner piezoelectric film 51b. This configuration is also realized by applying an anti-phase voltage to the outer piezoelectric films 51a or the inner piezoelectric films 51b in the drive part 50 provided on the both of right and left sides of the drive beam 42 on the lower side of the drawing.

Next, regarding the stress generated with the outer piezoelectric film 51a and the inner piezoelectric film 51b in the respective drive parts, the applied voltage to the respective outer piezoelectric films 51a and the inner piezoelectric films 51b is controlled so as to change the tensile stress to the compressive stress, while to change the compressive stress to the tensile stress. Thereafter, these operations are repeated at a predetermined drive frequency.

Figure 2:
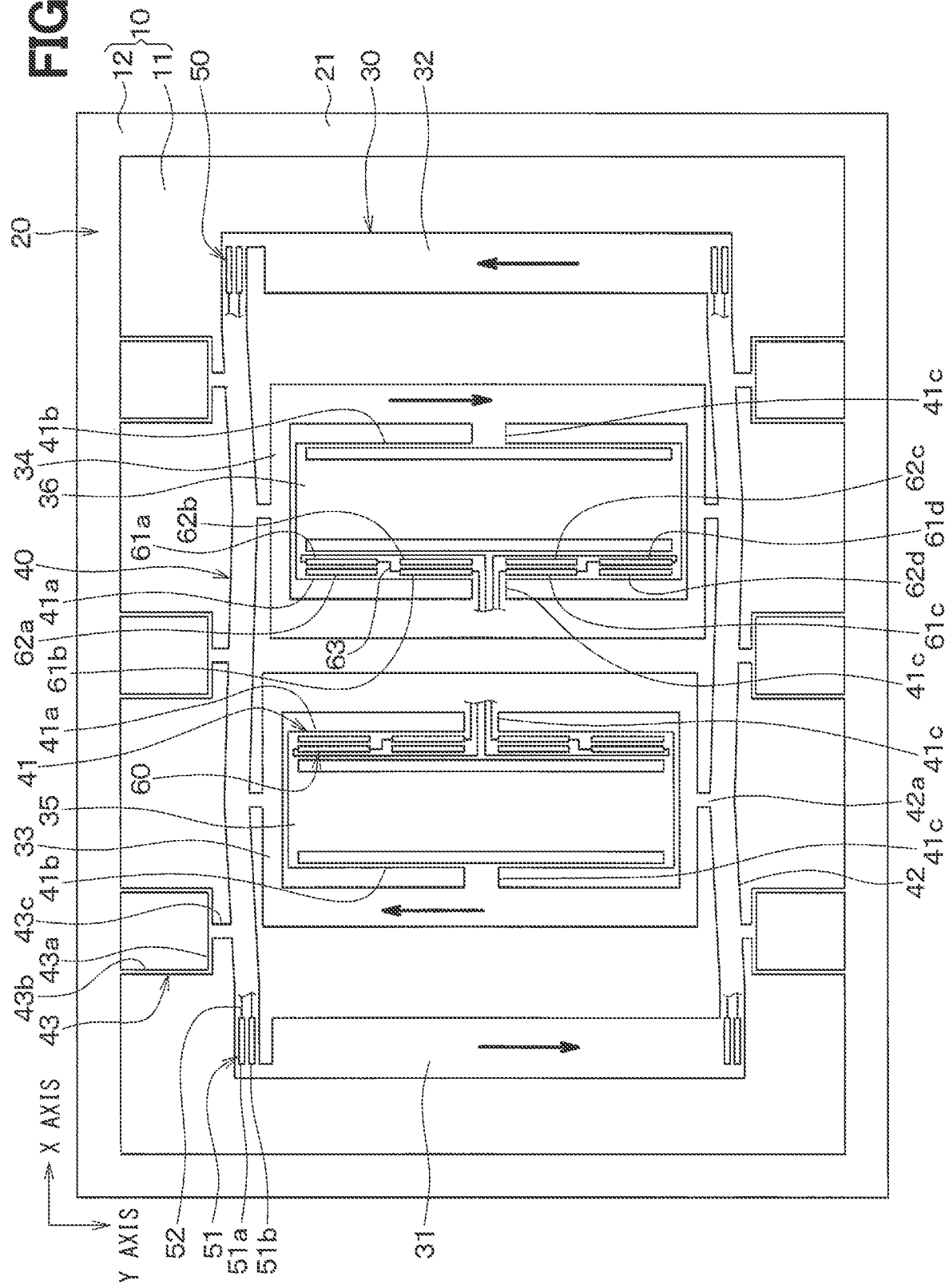
FIG. 2 is a schematic diagram showing a state of the vibration type angular velocity sensor during a basic operation.
Figure 3:
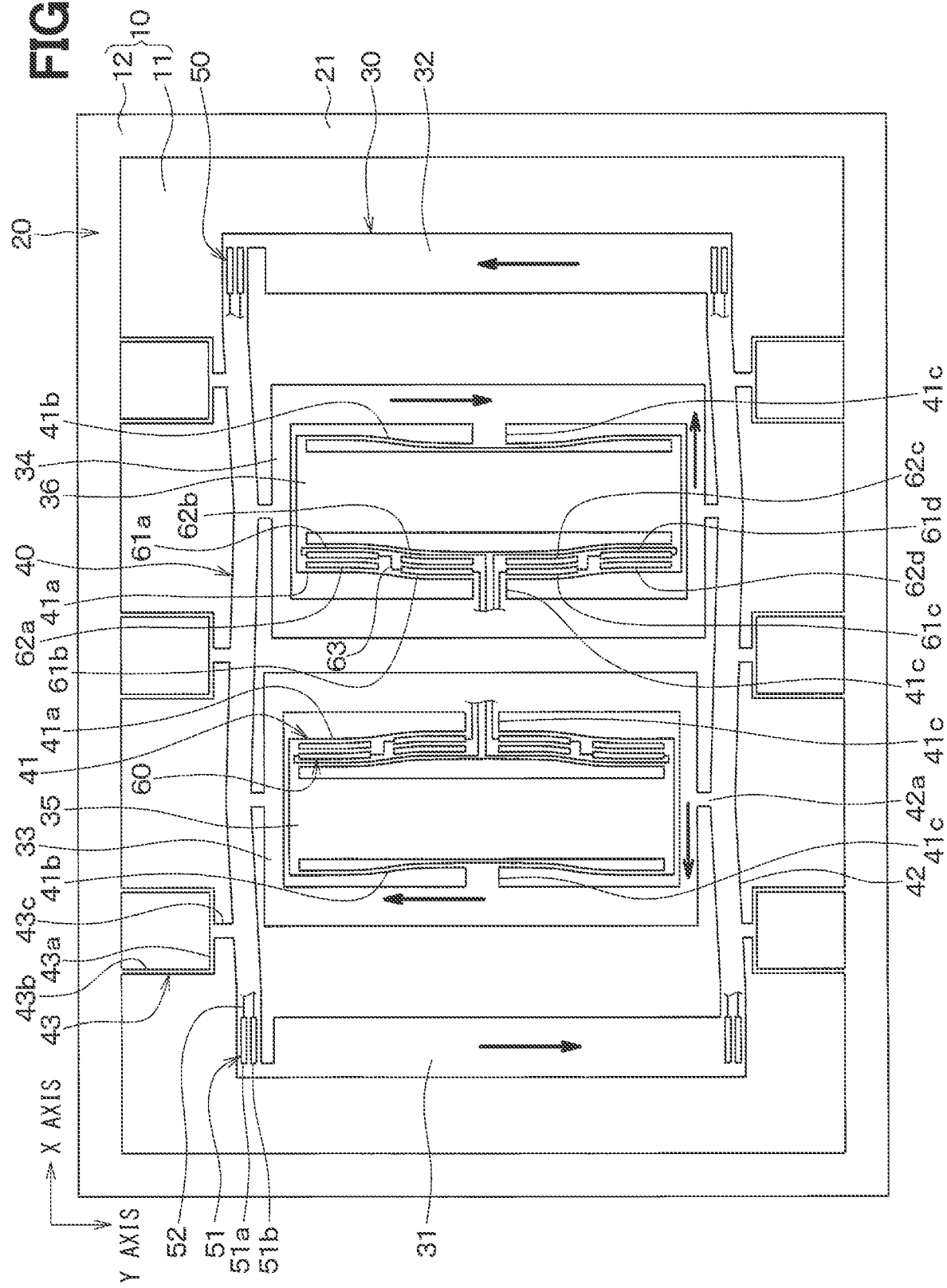
FIG. 3 is a schematic diagram showing a state when an angular velocity is applied to the vibration type angular velocity sensor.

With this configuration, as shown in FIG. 2, the outer drive weight 31 and the inner drive weight 33 are vibrated, mutually in an anti-phase, in the y-axis direction. Further, the outer drive weight 32 and the inner drive weight 34 are vibrated, mutually in an anti-phase, in the y-axis direction. Further, the two inner drive weights 33 and 34 are vibrated in an anti-phase in the y-axis direction, and the two outer drive weights 31 and 32 are also vibrated in an anti-phase in the y-axis direction. With this configuration, the vibration type angular velocity sensor is driven in a drive mode form.

Note that at this time, the movement of the respective weights 31 to 34 in the y-axis direction is allowed by the S-shape rippling of the drive beam 42. As the connection part 43c connecting the rotating beam 43a to the drive beam 42 is an amplitude node, i.e., a steady point, the connection part 43c is almost not displaced. When a shock or the like is applied, as the support beam 43b is displaced, the movement of the respective weights 31 to 36 in the x-axis direction is allowed. The output change due to the shock is mitigated, and an anti-shock property is obtained.

Next, a state when an angular velocity is applied to the vibration type angular velocity sensor will be described with reference to FIG. 3. During the basic operation as described above in FIG. 2, when an angular velocity about the z-axis is applied to the vibration type angular velocity sensor, the detection weights 35 and 36 are displaced in the direction intersecting the y-axis, i.e., the x-axis direction, with the Coriolis force, as shown in FIG. 3. More particularly, as the detection weights 35 and 36 and the inner drive weights 33 and 34 are connected via the detection beam 41, the detection weights 35 and 36 are displaced based on the elastic deformation of the detection beam 41. In accordance with the elastic deformation of the detection beam 41, tensile stress is applied to the detection piezoelectric films 61a to 61d provided in the first detection beam 41a. Accordingly, the output voltage of the detection piezoelectric films 61a to 61d changes in correspondence with the applied tensile stress, and is outputted through the detection wiring 63 to the outside. It is possible to detect the applied angular velocity by reading the output voltage.

Figure 4:
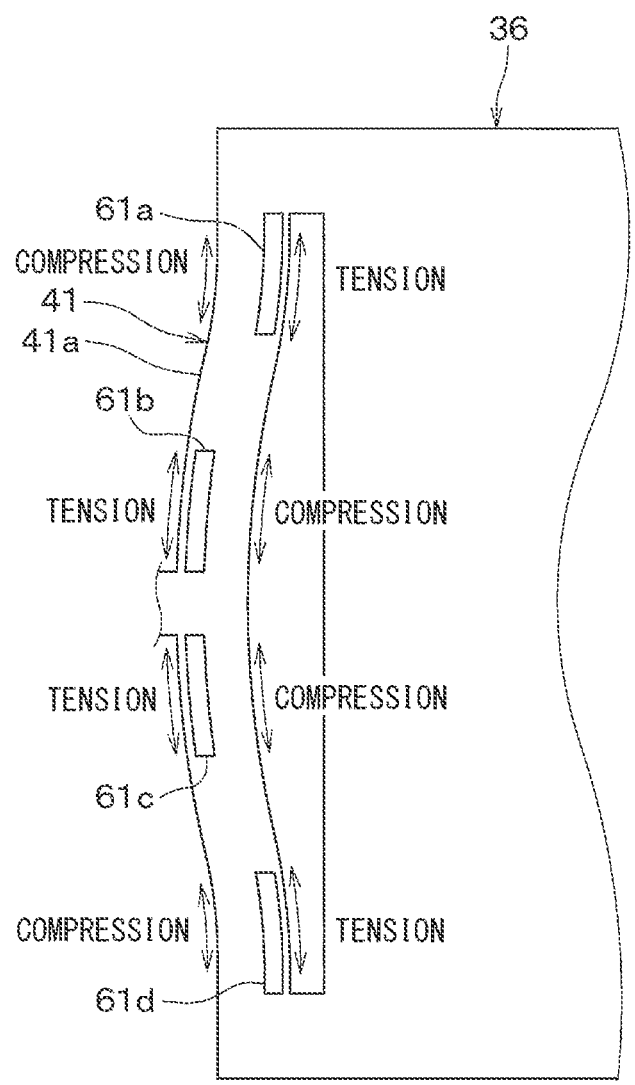
FIG. 4 is an enlarged view showing a state of displacement of a first detection beam in FIG. 3.

Especially, as the detection piezoelectric films 61a to 61d are provided in the vicinity of the connection part to the detection weights 35 and 36 and the connection part to the inner drive weights 33 and 34, in the detection beam 41, the maximum tensile stress is applied to the detection piezoelectric films 61a to 61d as shown in FIG. 4. Accordingly, it is possible to further increase the output voltage of the detection piezoelectric films 61a to 61d.

At this time, in the present embodiment, as the detection beam 41 is configured with the first detection beam 41a and the second detection beam 41b having different spring constants, it is possible to obtain the following advantages.

First, the first detection beam 41a and the second detection beam 41b are configured to have different spring constants, such that the dimension of the first detection beam 41a in the x-axis direction is large. In this manner, when the dimension of the first detection beam 41 in the x-axis direction is large, the area for formation of the detection piezoelectric films 61a to 61d is wide. It is possible to increase the change of the output voltage of the detection piezoelectric films 61a to 61d with respect to the displacement of the first detection beam 41. Accordingly, it is possible to improve the sensitivity of the vibration type angular velocity sensor.

However, when the spring constant of the first detection beam 41a is large, the frequency of the displacement of the detection weights 35 and 36 upon application of the angular velocity (hereinbelow, "detection vibration frequency") is too high. Accordingly, the first detection beam 41a and the second detection beam 41b are configured to have different spring constants, and the x-axis directional dimension of the second detection beam 41b is suppressed while the x-axis directional dimension of the first detection beam 41a is made large.

With this configuration, even when the spring constant of the first detection beam 41a is large, as the spring constants of both of the first detection beam 41a and the second detection beam 41b are not large, it is possible to secure easiness of displacement of the detection weights 35 and 36. Further, it is possible to set the detection vibration frequency in a target frequency band, and to suppress the detection vibration frequency from becoming excessively high.

A detection resonance frequency influences the sensitivity. For example, the sensitivity is one to the square of the detection resonance frequency or one to the detection resonance frequency. When the detection resonance frequency is higher, the sensitivity is lower. Accordingly, as described above, by suppressing the detection resonance frequency from becoming excessively high and setting the detection resonance frequency in a target frequency band, even when the x-axis dimension of the first detection beam 41a is large, it is possible to suppress reduction of the sensitivity.

Further, as long as the detection resonance frequency is suppressed from becoming excessively high, a structure in which the detection beam 41 is provided only on one side to the detection weights 35 and 36, i.e., a structure provided with only the first detection beam 41a but without the second detection beam 41b, may be conceivable.

Figure 5A:
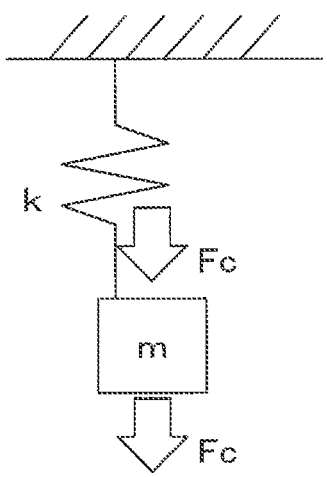
FIG. 5A is a schematic diagram showing a spring structure provided with only the first detection beam but not provided with a second detection beam.

However, in the case of this structure, as shown in FIG. 5A, the structure is equivalent to a structure having cantilevered detection weights 35 and 36. In this case, the detection resonance frequency is represented with the following expression to attain a desired frequency band. However, an unnecessary vibration mode to cause swing vibration i.e. pendular movement of the detection weights 35 and 36 occurs. Accordingly, it is not possible to realize the design idea to suppress the unnecessary vibration mode. Note that in FIG. 5A and FIG. 5B to be described later and in the following expression, alphabet k denotes a spring constant; m, the mass of the detection weights 35 and 36; and Fc, an applied physical quantity.

$$f = \frac{1}{2}\pi \sqrt{\frac{k}{m}} \qquad \text{[Expression 1]}$$

Figure 5B:
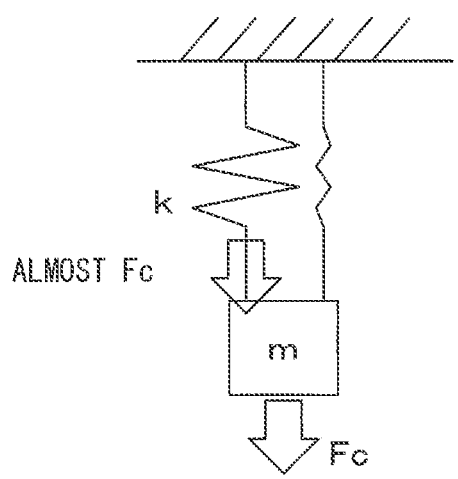
FIG. 5B is a schematic diagram showing the spring structure provided with the first detection beam and the second detection beam.

On the other hand, as in the case of the present embodiment, by providing the second detection beam 41b in which the x-axis directional dimension is suppressed, while providing the first detection beam 41a in which the x-axis directional dimension is large, as shown in FIG. 5B, it is possible to make the structure equivalent to the dual-support structure with the detection weights 35 and 36. With this configuration, it is possible to suppress occurrence of unnecessary vibration mode to cause swing vibration of the detection weights 35 and 36. Further, the spring constant of the second detection beam 41b is smaller than the spring constant of the first detection beam 41a. Accordingly, the detection resonance frequency is determined almost dependently on the spring constant of the first detection beam 41a. It is possible to reduce the influence of the spring constant of the second detection beam 41b, and to attain a detection resonance frequency almost in the above expression 1. Accordingly, as described above, it is possible to suppress the detection resonance frequency from becoming excessively high and set the detection resonance frequency in a target frequency band.

Further, in the present embodiment, the detection beam 41 is provided such that the y-axis direction as the drive vibration direction of the detection weights 35 and 36 is the longitudinal direction, it is possible to obtain the following advantages.

Figure 6:
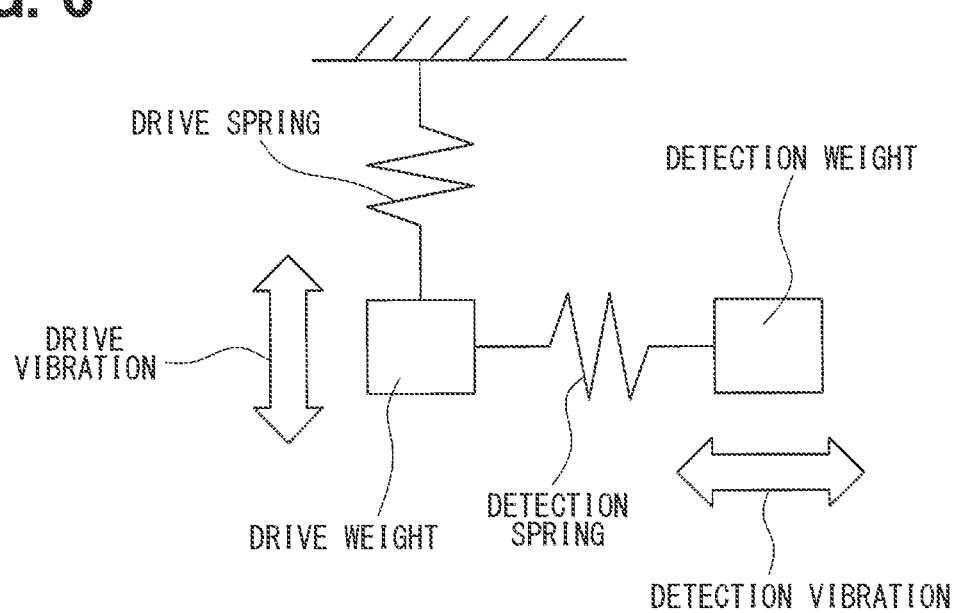
FIG. 6 is a schematic diagram showing the spring structure in the vibration type angular velocity sensor according to the first embodiment.

The vibration type angular velocity sensor according to the present embodiment has the spring structure shown in FIG. 6, in which when the inner drive weights 33 and 34 are vibrated by drive vibration, the detection weights 35 and 36 vibrate integrally with the inner drive weights 33 and 34. Regarding the detection beam 41 which connects the inner drive weights 33 and 34 to the detection weights 35 and 36, the detection beam 41 vibrates integrally with the detection weights 35 and 36 along the vibration direction.

Note that the detection beam 41 supports the detection weight 35 or the detection weight 36 at the both ends in the drive vibration direction. In other words, the both ends of the detection beam 41 are fixed with the detection weight 35 or the detection weight 36. Further, the detection beam 41 is extended along the vibration direction, and the longitudinal direction of the detection beam 41 is aligned to the y-axis direction the same as the drive vibration direction of the detection weights 35 and 36. Accordingly, the detection beam 41 itself plays a role of a "stopper rod". The detection beam 41 vibrates integrally with the detection weights 35 and 36 in the vibration direction, however, the detection beam 41 is provided so as to prevent deformation in the vibration direction by itself.

Accordingly, the detection beam 41 which plays a role of a detection spring and the detection piezoelectric films 61a to 61d provided on the detection beam 41 are provided such that when an angular velocity is not applied, they are not deformed along the vibration direction without difficulty, and unintended noise is not outputted without difficulty, upon drive vibration. That is, the vibration type angular velocity sensor according to the present embodiment has a structure in which, even when a processing error or the like occurs in the detection piezoelectric films 61a to 61d, output of unintended noise in accordance with drive vibration is suppressed.

Further, the detection beam 41 itself is provided so as not to be deformed intentionally without difficulty by drive vibration as described above, however, unintended rotational vibration of the detection weights 35 and 36 may occur upon drive vibration, due to a processing error or the like in the detection weights 35 and 36 or the like. Even when such leak vibration has occurred, to reduce the influence of the vibration, the detection beam 41 is connected to the inner drive weight 33 or the inner drive weight 34 in the center position in the longitudinal direction, and the detection piezoelectric films 61a to 61d are line-symmetrically provided around the center position. With this configuration, in the structure, a signal generated by deformation of the detection piezoelectric films 61a and 61b due to the rotational vibration and a signal generated by deformation of the detection piezoelectric films 61c and 61d offset each other.

Figure 7:
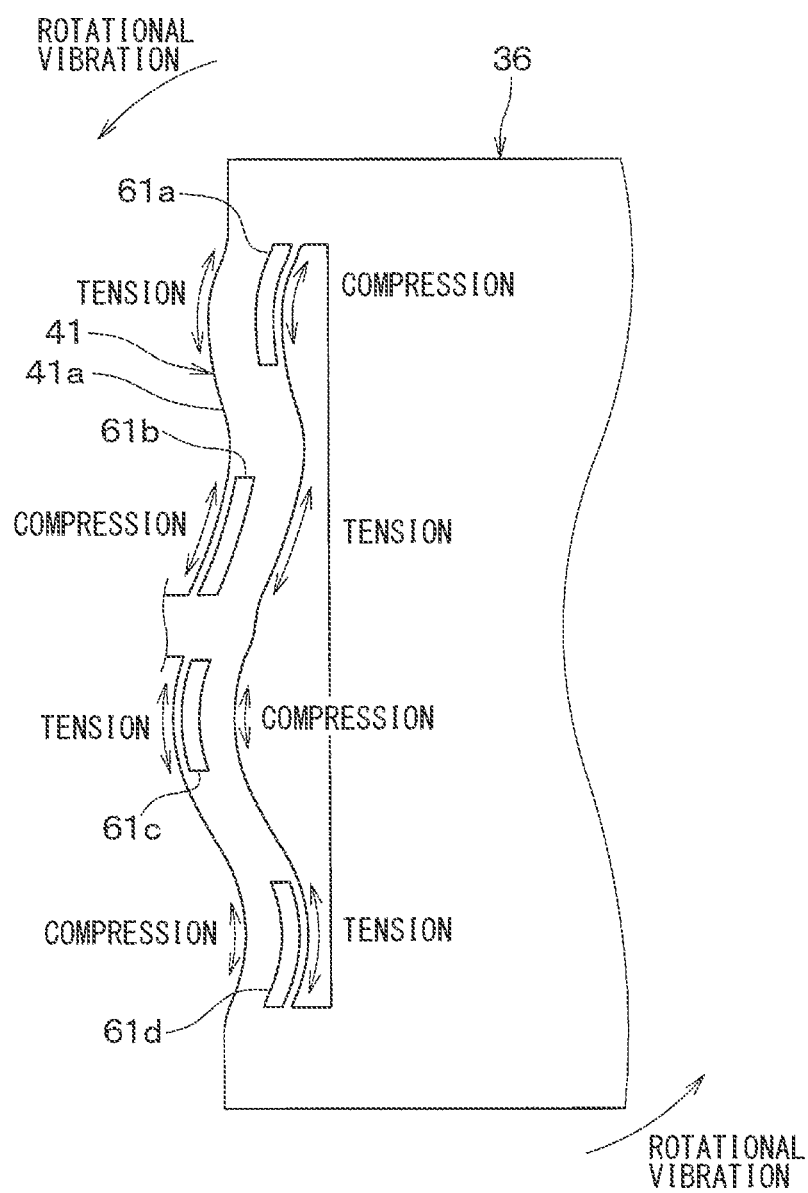

More particularly, as shown in FIG. 7, a case where, upon drive vibration, unintended rotational vibration occurs due to occurrence of a processing error in the detection weights or the like will be described. When unintended rotational vibration occurs in the detection weight, as shown in FIG. 7, for example, compressive stress occurs in the detection piezoelectric films 61a and 61b, and tensile stress occurs in the detection piezoelectric films 61c and 61d. That is, when the rotational vibration shown in FIG. 7 occurs, in the detection piezoelectric films 61a and 61b and the detection piezoelectric films 61c and 61d, deformation occurs respectively in a reverse direction. At this time, assuming that the direction of the electric current generated in the detection piezoelectric film with the tensile stress is positive, the direction of the electric current generated in the detection piezoelectric film with the compressive stress is negative. As shown in FIG. 1, as the detection piezoelectric films 61a to 61d are electrically connected with the detection wiring 63, the positive electric current and the negative electric current offset each other, thus signal(s) generated due to unintended rotational vibration is suppressed. Accordingly, as the detection beam 41 and the detection piezoelectric films 61a to 61d are provided as described above, a vibration type angular velocity sensor having a structure to suppress occurrence of leak vibration is obtained.

According to the present embodiment, the detection beam 41 is provided such that the vibration direction of the detection weights 35 and 36 and the drive weights 31 to 34 is the longitudinal direction, thus a structure in which unintended deformation by drive vibration is suppressed is obtained. Further, as the detection piezoelectric films 61a to 61d are line-symmetrically provided around the center position in the longitudinal direction of the detection beam 41, even when the detection weights 35 and 36 rotationally vibrate unintentionally, the electric charge caused from the detection piezoelectric films 61a to 61d by the rotational vibration is cancelled. As a result, a vibration type angular velocity sensor having a structure in which deformation of the detection beam 41 due to drive vibration is suppressed, and even when unintended rotational vibration occurs due to a processing error or the like, a signal as noise is suppressed, i.e., leak vibration is suppressed in comparison with the conventional vibration type angular velocity sensor, is obtained.

Further, in the structure, the spring constant of the first detection beam 41a and the spring constant of the second detection beam 41b are different, a vibration type angular velocity sensor having high sensitivity of angular velocity detection, in comparison with the conventional vibration type angular velocity sensor, is obtained.

Second Embodiment

The vibration type angular velocity sensor according to a second embodiment will be described with reference to FIG. 8.

Figure 8:
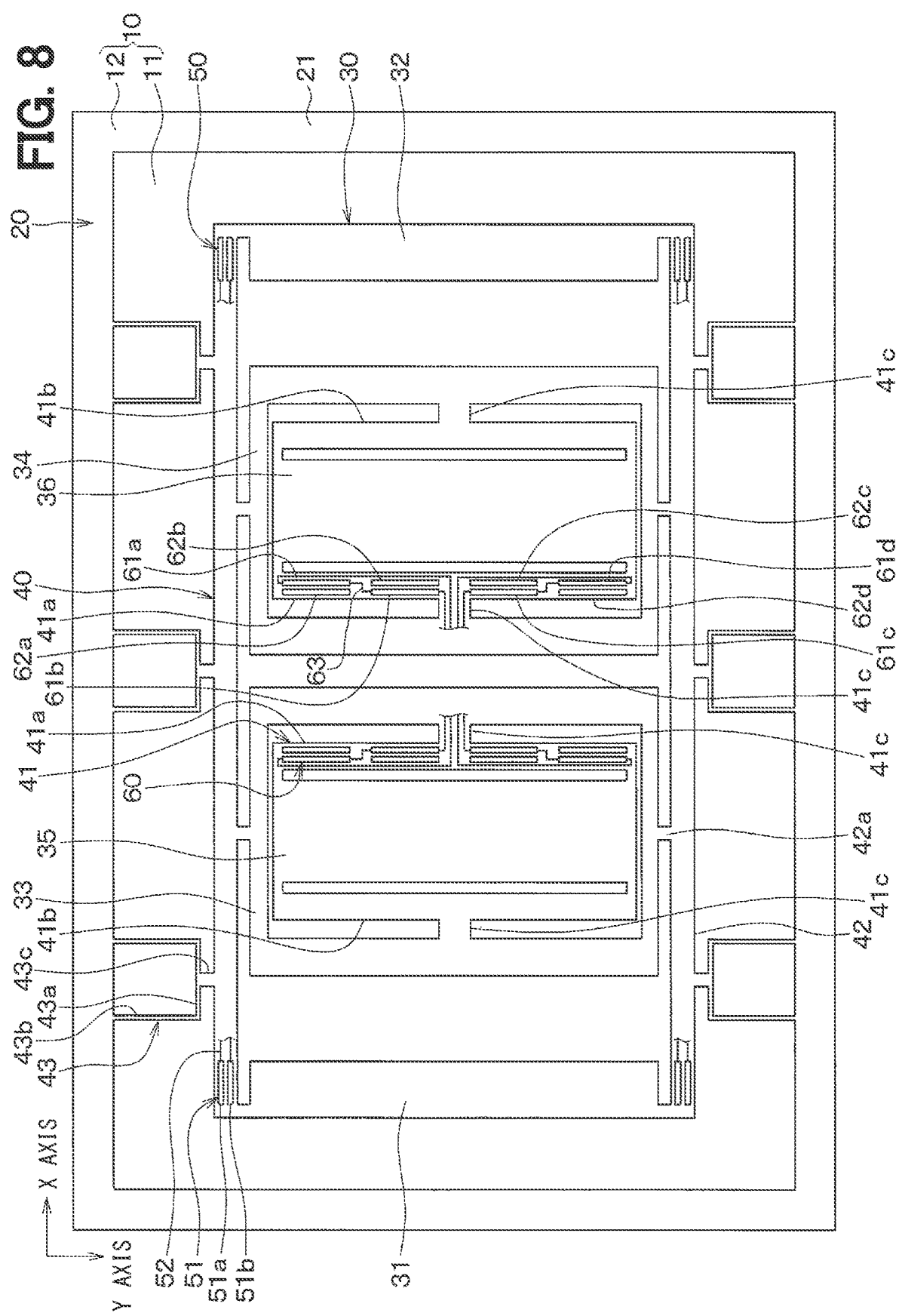
FIG. 8 is a plane schematic diagram showing the vibration type angular velocity sensor according to a second embodiment.

The vibration type angular velocity sensor according to the present embodiment is different from the above-described first embodiment in that as shown in FIG. 8, the vibration type angular velocity sensor has a structure in which the x-axis dimension of the second detection beam 41b is the same as the x-axis dimension of the first detection beam 41a, i.e., the spring constants are the same.

Even when the spring constants of the first detection beam 41a and the second detection beam 41b correspond with each other, as long as the detection beam 41 is provided such that the drive vibration direction is the longitudinal direction, unintended deformation of the detection beam 41 by drive vibration is suppressed. Accordingly, to increase the sensitivity of angular velocity detection in addition to the suppression of leak vibration, it is preferable that the vibration type angular velocity sensor has the above-described structure according to the first embodiment. However, when the vibration type angular velocity sensor has a structure merely to suppress leak vibration, there is no problem when the spring constants of the first detection beam 41a and the second detection beam 41b correspond with each other.

According to the present embodiment, as in the case of the above-described first embodiment, a vibration type angular velocity sensor in which leak vibration is suppressed, in comparison with the conventional vibration type angular velocity sensor, is obtained.

Other Embodiments

The present disclosure has been described in conformity with the embodiments, however, it is understood that the present disclosure is not limited to the embodiments and the structures. The present disclosure also encompasses variations in the various modifications and equivalents range. Additionally, various combinations and forms, furthermore, even other combinations and forms including the only one component, more, or less, are intended to fall within the scope and spirit of the present disclosure.

(1) For example, in the above-described respective embodiments, the example where the detection beam 41 has a shape linearly extended along the vibration direction of the detection weights 35 and 36 has been described. However, as long as the detection beam 41 is displaced in the direction intersecting the vibration direction and detects an angular velocity, the shape of the detection beam 41 is not limited to the linear shape, and may be a curved shape or other shapes.

(2) In the above-described respective embodiments, the example of a dual-support structure in which, from a viewpoint of improvement of sensitivity of angular velocity detection, the detection weights 35 and 36 are respectively supported, at one end with the first detection beam 41a, and at the other end, with the second detection beam 41b, in the x-axis direction, has been described. However, as a viewpoint of suppression of leak vibration in accordance with drive vibration, a structure in which the detection beam 41 has a shape extended along the vibration direction, and supports the detection weights 35 and 36 at both ends in the vibration direction, may be used. Accordingly, a structure in which the detection beam 41 is configured only with the first detection beam 41a or the second detection beam 41b, i.e., the respective detection weights 35 and 36 are supported with the detection beam 41 at one end in the vertical direction to the vibration direction, may be used.

(3) In the above-described respective embodiments, the example where the vibration type angular velocity sensor is a so-called yaw gyro sensor to cause plane driving and detect an angular velocity of rotation about the normal line direction to the plane, has been described. The vibration type angular velocity sensor is not limited to this gyro sensor, but may be a rollover gyro sensor. In this manner, in the vibration type angular velocity sensor according to the present disclosure, as long as the detection beam 41 is provided such that the longitudinal direction of the detection beam 41 is aligned with the vibration direction of the drive weights 31 to 34 and the detection weights 35 and 36, design of other constituent elements may be arbitrarily changed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A vibration angular velocity sensor to detect an angular velocity, comprising:
    a substrate;
    a drive beam supported via a support member with a fixing part disposed on the substrate;
    a drive weight supported with the drive beam;
    a detection weight supported via a beam part including a detection beam with respect to the drive weight; and
    a detection part arranged in the detection beam, and generating an electric output corresponding to a displacement of the detection beam in accordance with a movement of the detection weight when the detection weight moves in one direction based on an application of an angular velocity, wherein:
    the detection weight is connected via the detection beam to the drive weight, and is connected via the drive weight to the fixing part;
    a direction in which the drive weight and the detection weight vibrate while driving the drive beam is defined as a vibration direction;
    when the angular velocity is applied while the drive weight and the detection weight vibrate and are driven by the drive beam, the detection beam is displaced in a direction intersecting the vibration direction;
    the angular velocity is detected based on a change of an output voltage of a detection piezoelectric film in accordance with a displacement of the detection beam;
    the detection part includes the detection piezoelectric film having a plurality of detection piezoelectric film parts and a plurality of dummy piezoelectric film parts; and
    the plurality of detection piezoelectric film parts and the plurality of dummy piezoelectric film parts are symmetrically arranged along the vibration direction.

2. The vibration angular velocity sensor according to claim 1, wherein:

a direction perpendicular to the vibration direction is defined as a vertical direction;

the detection beam is arranged to be spaced apart from the detection weight in the vertical direction; and the detection beam supports the detection weight at one or both ends of the detection weight in the vertical direction with both ends of the detection beam in the vibration direction.

3. The vibration angular velocity sensor according to claim 1, wherein:

the detection weight includes two detection weight parts as a pair;

the detection beam has a first detection beam and a second detection beam;

the drive weight has a pair of inner drive weights surrounding a periphery of one of the detection weight parts and connecting the detection weight parts via the first detection beam and the second detection beam, and a pair of outer drive weights respectively disposed on both sides of the pair of inner drive weights with sandwiching the inner drive weights;

the drive beam connects the inner drive weights to the outer drive weights; and the drive beam is supported with the substrate via the support member;

the vibration type angular velocity sensor further comprising:

a drive part that vibrates the inner drive weights and the outer drive weights mutually in a reverse direction, wherein:

the drive part bends the drive beam to drive and vibrate the outer drive weights and the inner drive weights.

4. The vibration angular velocity sensor according to claim 1, wherein:

the detection beam is a bar-shaped beam linearly extending along the vibration direction.

5. The vibration angular velocity sensor according to claim 1, wherein:

the detection beam is connected to the drive weight at a center position in the vibration direction of the detection beam; and the detection part has a detection piezoelectric film, and is symmetrically arranged in the vibration direction around the center position.

* * * * *